(12) United States Patent
Mangelberger et al.

(10) Patent No.: US 10,731,271 B2
(45) Date of Patent: Aug. 4, 2020

(54) SILICON WAFER WITH HOMOGENEOUS RADIAL OXYGEN VARIATION

(71) Applicant: SILTRONIC AG, Munich (DE)

(72) Inventors: Karl Mangelberger, Ach (AT); Walter Heuwieser, Stammham (DE); Michael Skrobanek, Freiberg (DE)

(73) Assignee: SILTRONIC AG, Munich (DE)

( * ) Notice: Subject to any disclaimer, the term of this patent is extended or adjusted under 35 U.S.C. 154(b) by 209 days.

(21) Appl. No.: 16/065,268

(22) PCT Filed: Dec. 7, 2016

(86) PCT No.: PCT/EP2016/080080
§ 371 (c)(1),
(2) Date: Jun. 22, 2018

(87) PCT Pub. No.: WO2017/108406
PCT Pub. Date: Jun. 29, 2017

(65) Prior Publication Data
US 2020/0149184 A1  May 14, 2020

(30) Foreign Application Priority Data
Dec. 22, 2015  (DE) .................. 10 2015 226 399

(51) Int. Cl.
| *B32B 3/00* | (2006.01) |
| *C30B 15/04* | (2006.01) |
| *C30B 30/04* | (2006.01) |
| *C30B 29/06* | (2006.01) |
| *C30B 15/30* | (2006.01) |

(52) U.S. Cl.
CPC ............ *C30B 15/04* (2013.01); *C30B 15/305* (2013.01); *C30B 29/06* (2013.01); *C30B 30/04* (2013.01)

(58) Field of Classification Search
CPC ....... C30B 15/04; C30B 15/305; C30B 29/06; C30B 30/04
See application file for complete search history.

(56) References Cited

U.S. PATENT DOCUMENTS

| 5,306,387 A | 4/1994 | Fusegawa et al. |
| 5,359,959 A | 11/1994 | Fusegawa et al. |
| 5,968,264 A | 10/1999 | Iida et al. |
| 6,156,119 A | 12/2000 | Hoshi et al. |

(Continued)

FOREIGN PATENT DOCUMENTS

| CN | 101187056 A | 5/2008 |
| CN | 101423976 A | 5/2009 |

(Continued)

OTHER PUBLICATIONS

'Golla Eranna, "Crystal Growth and Evaluation of Silicon for VLSI and ULSI," Jan. 1, 2015, CRC Press, ISBN:978-1-4822-3282-0, 6 pages.

*Primary Examiner* — Elizabeth E Mulvaney
(74) *Attorney, Agent, or Firm* — Brooks Kushman P.C.

(57) ABSTRACT

The invention relates to a silicon wafer having a radial variation of oxygen concentration of less than 7%, determined over the entire radius of the silicon wafer. The wafers are produced in the $P_V$ region with rotation of crystal and crucible in the same direction, and in the presence of a horizontal magnetic field of defined intensity.

15 Claims, 4 Drawing Sheets

(56) References Cited

U.S. PATENT DOCUMENTS

| | | |
|---|---|---|
| 6,159,438 A | 12/2000 | Iida et al. |
| 6,458,204 B1 | 10/2002 | Okui et al. |
| 6,843,848 B2 | 1/2005 | Von Ammon et al. |
| 7,273,647 B2 | 9/2007 | Nishikawa et al. |
| 7,378,071 B2 * | 5/2008 | Cho ................ C30B 15/305 117/13 |
| 9,458,554 B2 | 10/2016 | Mueller et al. |
| 2004/0180505 A1 | 9/2004 | Tobe |
| 2008/0096371 A1 | 4/2008 | von Ammon et al. |
| 2008/0113171 A1 | 5/2008 | Nakai et al. |
| 2009/0114147 A1 | 5/2009 | Cho et al. |
| 2010/0101485 A1 | 4/2010 | Fu et al. |
| 2010/0288184 A1 | 11/2010 | Ono et al. |

FOREIGN PATENT DOCUMENTS

| | | |
|---|---|---|
| DE | 691 13 873 T2 | 6/1996 |
| DE | 691 15 131 T2 | 8/1996 |
| DE | 103 39 792 A1 | 10/2004 |
| DE | 10 2012 214 085 A1 | 5/2014 |
| JP | 07291782 A | 11/1995 |
| JP | 2003-68743 A | 3/2003 |
| JP | 2007204312 A | 8/2007 |
| JP | 2008103673 A | 5/2008 |
| WO | 98/45508 A1 | 10/1998 |

* cited by examiner

SILICON WAFER WITH HOMOGENEOUS RADIAL OXYGEN VARIATION

CROSS REFERENCE TO RELATED APPLICATIONS

This application is the U.S. National Phase of PCT Appln. No. PCT/EP2016/080080 filed Dec. 7, 2016, which claims priority to German Application No. 10 2015 226 399.1 filed Dec. 22, 2015, the disclosures of which are incorporated in their entirety by reference herein.

BACKGROUND OF THE INVENTION

1. Field of the Invention

The invention relates to a silicon wafer having a homogeneous radial oxygen variation.

2. Description of the Related Art

Because of their properties, silicon wafers are suitable in particular as substrate wafers, on the upper side surface (front side) of which an epitaxial layer is deposited. A silicon wafer having a deposited epitaxial layer is also referred to as an epitaxial silicon wafer.

The region of the silicon wafer in which the electronic components are placed must be protected against contamination by metal traces. In the case of epitaxial silicon wafers, this region usually lies in the epitaxial layer. Particularly effective protection against metallic impurities is formed by BMDs (bulk microdefects), precipitates of oxygen in the substrate wafer, because they constitute so-called internal getters at which the metallic impurities preferentially accumulate. BMDs grow from nuclei, usually in the course of one or more heat treatments which are necessary for the production of electronic components. It is therefore necessary for an epitaxial silicon wafer, on delivery to the manufacturer of electronic components, to have sufficient BMD nuclei in the substrate wafer so that a high density of BMDs can be formed.

The deposition of the epitaxial layer on the substrate wafer is carried out at temperatures of more than 1000° C. At such temperatures, smaller BMD nuclei are eliminated, which also makes it more difficult to provide a sufficient number of BMD nuclei in heavily doped substrate wafers.

If the single crystal from which the silicon wafer is obtained is pulled according to the Czochralski (CZ) method from a melt which is held in a quartz crucible, the crucible material forms the source of oxygen which is incorporated into the single crystal and the silicon wafer obtained therefrom.

Control of the ratio V/G of the pulling rate V and the axial temperature gradient G at the crystallization boundary is of particular importance during the pulling of a silicon single crystal according to the CZ method.

The pulling rate V is the speed with which the growing single crystal is raised upward from the melt, and the axial temperature gradient G indicates the variation in temperature at the crystallization boundary in the direction of the crystal advance.

BMDs can be developed particularly in a region in which the number of vacancies exceeds the number of interstitial silicon atoms, and in which vacancies therefore dominate.

The point defects include interstitial silicon atoms (silicon self-interstitials) and vacancies, which are formed at the growth front of the single crystal. They very substantially determine the radial and axial defect distributions occurring later in the single crystal, and also influence the extraneous material distributions which occur. For example, vacancies contribute to the precipitation of oxygen.

If the ratio V/G lies above a critical value k1, then vacancy defects predominantly occur, which can agglomerate and may then, for example, be identified as COPs (crystal originated particles). Depending on the detection method, they are sometimes also referred to as LPDs (light point defects) or LLSs (localized light scatterers).

If the ratio V/G lies below a critical value k2, which is less than k1, then point defects in the form of interstitial atoms (silicon self-interstitials) predominantly appear, which can likewise form agglomerates and are manifested macroscopically as dislocation loops. Agglomerates of interstitial atoms form local crystal dislocations, which because of the detection method used are also referred to as LPITs (large etch pits).

In the broadest sense, the region in which agglomeration neither of vacancies nor of interstitial atoms occurs, i.e. in which V/G lies between k1 and k2, is referred to as a neutral zone or perfect region. The value of V/G in which the crystal changes from vacancy to interstitial excess naturally lies between k1 and k2.

In the narrower sense, however, distinction is further made between a region in which there are nonagglomerated vacancies that are still free, and a region identified as a region of free interstitial atoms. The vacancy region, also referred to as the v region (vacancies) is distinguished in that, in the event of a sufficiently high oxygen content of the single crystal, oxygen-induced stacking faults occur, while the i region (interstitial) remains fully free of defects. In this narrower sense, only the i region is therefore an actually perfect crystal region.

Vacancies contribute to the precipitation of oxygen. When they exceed a size of about 70 nm, oxygen precipitates form oxygen-induced stacking faults (OSFs). OSFs are therefore encountered primarily in the v region.

The axial temperature gradient G at the crystallization boundary, and its radial profile, are determined by the heat transport from and to the crystallization boundary. The heat transport is in turn substantially influenced by the thermal properties of the environment of the growing single crystal, the so-called hot zone, and by the supply of heat by one or more heating devices.

If the decision is made to pull a single crystal in a particular hot zone, the axial and radial profile of the axial temperature gradient G at the crystallization boundary may be determined by means of simulation calculations which take the heat balance into account.

In order to keep the ratio V/G in an intended range in the axial direction as well, it is necessary to compensate for the variation of the axial temperature gradient G as a function of time by a corresponding variation of the pulling rate V. By controlling the pulling rate V, it is thus also possible to control the ratio V/G.

WO 98/45508 A1 is one of many publications which describes how the profile of the pulling rate V as a function of time can be determined experimentally so that, by controlling the pulling rate V, the ratio V/G can be made to remain almost unchanged during the growth of the single crystal, and the single crystal can grow in an intended region. Furthermore, detection methods for characterizing and differentiating between a Pv region and a Pi region are described.

U.S. Pat. No. 5,968,264 A discloses a method for the production of a silicon single crystal according to a Czochralski method, wherein, during the growth of the silicon single crystal from a silicon melt, the pulling is carried out in such a way that there is a solid/liquid interface in the crystal in a region with an average vertical position of the solid/liquid interface of +/−5 mm, an edge region with a width of 5 mm being excluded.

In one embodiment, the crystal is pulled in the v or i region.

It is disclosed that a horizontal magnetic field with an intensity of not less than 2000 Gs (gauss) is to be applied to the silicon melt. The application of a magnetic field to the melt leads to a smaller temperature gradient G and to flattening of the solid/liquid interface. The v or i region is extended. Furthermore, the axial profile of the oxygen concentrations can be controlled with magnetic fields.

U.S. Pat. No. 6,159,438 A, which is based on the same priority application as U.S. Pat. No. 5,968,264 A, claims a silicon single crystal which is drawn by means of a Czochralski method, wherein the variation of the oxygen concentration in a direction which is perpendicular to a growth direction is not more than 5%.

The oxygen concentrations in the growth direction were determined on a cut crystal, measurements being carried out at the center of the crystal and in an edge region having a distance of 10 mm from the edge. However, the example and comparative example, cf. FIGS. 11A and 11B, differ from one another only, in that a solid/liquid interface thermal insulator present in the example, and an annular thermal insulator arranged thereon, were removed in the comparative example. The effect in terms of homogenization of the axial oxygen variations at the center of the crystal and in an edge region having a distance of 10 mm from the edge is thus attributable only to the presence of these thermal insulators.

It is however found that, specifically in the edge region not considered in this case (distance 10 mm from the edge), the oxygen concentration decreases significantly. This is seen both in the case of crystals with a diameter of 200 mm as according to U.S. Pat. No. 6,159,438 A, and in the case of silicon crystals with a diameter of 300 mm in a region with a distance of 140-150 mm from the center.

This decrease in the oxygen concentration at the edge has a negative effect on the mechanical stability of the silicon wafers. Furthermore, in the case of epitaxial silicon wafers this leads to a low BMD density in the edge region. This can lead to lattice defects and overlay problems for customers. The reasons for the creation of overlay defects are stresses in the crystal lattice due to a low density of BMDs, because in such cases the effect of BMDs blocking dislocations in the crystal lattice, so-called pinning, is exhibited too weakly.

The object of the invention is based on the previously described problem.

SUMMARY OF THE INVENTION

The object of the invention is achieved by a silicon wafer having a radial variation of the oxygen concentration of less than 7%, determined over the entire radius of the silicon wafer.

DETAILED DESCRIPTION OF THE PREFERRED EMBODIMENTS

Figure 1:
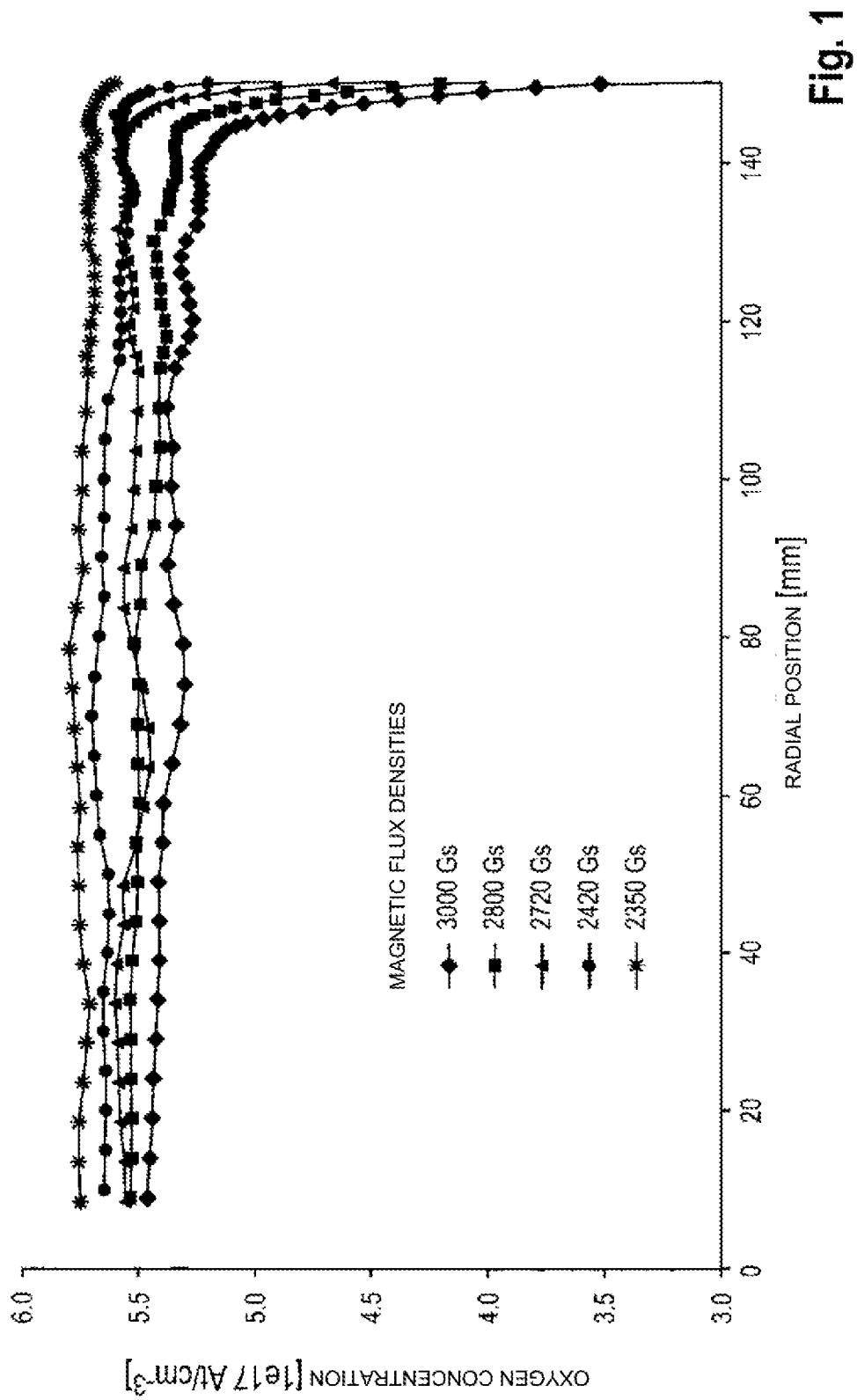
FIG. 1 shows radial oxygen profiles in the case of different magnetic flux densities.

The radial variation of the oxygen concentration is determined as follows:

$$(O_{max}-O_{min}/O_{min})*100\%,$$

where $O_{max}$ denotes the maximum oxygen concentration over the entire radius of the silicon wafer, and $O_{min}$ denotes the minimum oxygen concentration over the entire radius of the silicon wafer.

The measurement of the oxygen concentration is carried out by means of FTIR according to SEMI MF951. For example, the Bruker Equinox55s spectrometer is suitable for this. With this instrument, standard SEMI wafers with diameters of 100, 125, 150, 200 and 300 mm can be measured. It is, however, also suitable for studying ingot pieces.

In order to determine the oxygen concentration in the edge region, it is advantageous to study ingot pieces and not standard wafers. In this way, it is also possible to study the oxygen concentration in the edge region of crystals with a diameter of 450 mm.

The silicon wafer exhibits a radial variation of the oxygen concentration of less than 7%, the entire radius of the silicon wafer being taken into account. In one embodiment, the radial variation of the oxygen concentration of the silicon wafer is less than 5%. Preferably, the radial variation of the oxygen concentration of the silicon wafer is less than 2%.

The silicon wafer has a diameter of 150 mm, 200 mm, 300 mm or 450 mm.

In one embodiment, the silicon wafer is epitaxially coated.

In one embodiment, the silicon wafer is heat-treated before the epitaxial coating, in order to stabilize BMD nuclei.

In another embodiment, the silicon wafer is doped with nitrogen and has a nitrogen concentration of not less than $5\times10^{12}$ atoms/cm$^3$ and not more than $3.5\times10^{13}$ atoms/cm$^3$.

Preferably, the oxygen concentration in the silicon wafer is from $5\times10^{17}$ atoms/cm$^3$ to $6\times10^{17}$ atoms/cm$^3$.

In one embodiment, the silicon wafer is doped with boron. The boron concentration lies in a range of from $3.10\times10^{18}$ atoms/cm$^3$ to $8.43\times10^{18}$ atoms/cm$^3$.

In another embodiment, the silicon wafer is doped with nitrogen and hydrogen. A nitrogen concentration is not less than $5\times10^{12}$ atoms/cm$^3$ and not more than $3.5\times10^{13}$ atoms/cm$^3$. A hydrogen concentration is not less than $3\times10^{13}$ atoms/cm$^3$ and not more than $8\times10^{13}$ atoms/cm$^3$.

In one embodiment, the silicon wafer is provided with an epitaxial layer, the epitaxial silicon wafer being p/p+ doped and comprising BMD nuclei whose density, averaged over the radius of the silicon wafer, determined by IR tomography, is not less than $1\times10^5$ cm$^{-3}$ and not more than $1\times10^7$ cm$^{-3}$. Furthermore, the variation of the density of BMD nuclei along the radius of the epitaxial silicon wafer is low. The density of BMD nuclei varies by no more than 20% from the average value from the center to the edge of the epitaxial silicon wafer.

In one embodiment, the silicon wafer is provided with an epitaxial layer, the epitaxial layer being p/p− doped and having a BMD density in the region of the silicon substrate wafer from the center to the edge of the epitaxial silicon wafer of not less than $1\times10^8$ cm$^{-3}$, preferably not less than $5\times10^8$ cm$^{-3}$, after a heat treatment at a temperature of 1000° C. over a period of 16 h. Furthermore, the variation of the BMD density along the radius of the epitaxial silicon wafer is low. The BMD density varies by no more than 20% from the average value from the center to the edge of the epitaxial silicon wafer.

The silicon wafer according to the invention may be produced according to the invention by a method comprising
a) providing a silicon melt in a crucible;
b) pulling a silicon single crystal from the melt according to the CZ method, oxygen being incorporated into the single crystal;
c) applying a horizontal magnetic field to the melt during the pulling of the silicon single crystal;
d) rotating the growing crystal and the crucible during the pulling of the single crystal;
e) providing the silicon wafer by processing the silicon single crystal; wherein a magnetic flux density of the applied horizontal magnetic field is 1900-2600 Gs in the middle of the crucible, and the growing crystal is rotated at at least 8 rpm.

In one embodiment, the magnetic flux density is 2000-2400 Gs.

In another embodiment, the magnetic flux density is 2150-2350 Gs.

Expressed in SI units, 1 Gs=0.1 mT.

Preferably, the crystal and the crucible are rotated in the same sense.

In another embodiment, the crucible is rotated at 0.3-0.8 rpm.

In a particularly preferred embodiment, the growing crystal is rotated at at least 10 rpm.

The provision of the silicon wafer comprises cutting of the crystal into wafers and subsequently performing various mechanical and chemical-mechanical processing steps of the side surfaces and the edge on the silicon wafer.

In one embodiment, the silicon wafer is provided with an epitaxial layer on a polished side surface.

It has been found that a homogeneous radial oxygen distribution of the silicon wafer can be achieved, also taking into account the complete edge region of the silicon wafer, only when both the magnetic flux density lies in the range specified above and a particular minimum speed is complied with for the crystal rotation.

When applying high magnetic flux densities, for example of 2700 Gs, a strong decrease in the oxygen concentration at the edge is found, in the case of 300 mm wafers for example in a region with a distance of 140-150 mm from the center of the wafer. The effect of this is that the radial variation of the oxygen concentration over the entire radius of the wafer can be more than 10%.

Such a decrease in the oxygen concentration at the edge is likewise found when the rotational speed of the crystal is less than 8 rpm. The rotation, known per se, of the crystal and the crucible is carried out by means of a suitable drive unit.

It is particularly advantageous that pulling of the crystals can be carried out without LPits and COPs despite the reduction of the magnetic field. To date, it has been assumed that high magnetic flux densities (for example 3000 Gs) are needed in order to homogenize V/G.

By reducing the edge decrease in the oxygen concentration, the BMD density can be kept high at the edge of an epitaxial silicon wafer, or in a silicon wafer which has been subjected to a heat treatment.

In one embodiment, an epitaxial silicon wafer which is p/p+ doped is produced. To this end oxygen and boron are incorporated into the single crystal during the pulling of the single crystal, the concentration of oxygen in the single crystal being not less than $5\times10^{17}$ atoms/cm$^3$ and not more than $6\times10^{17}$ atoms/cm$^3$, and the resistivity of the single crystal being not less than 5 mΩcm and not more than 10 mΩcm.

A heat treatment of the silicon substrate wafer before the epitaxy, for the purpose of stabilizing BMD nuclei, is not necessary when the single crystal is pulled and cooled under conditions which reinforce the creation of BMD nuclei and their stabilization.

In particular, the single crystal should be cooled relatively slowly in the temperature range of from 1000° C. to 800° C., in which case the cooling rate in this temperature range is not less than 0.5° C./min and not more than 1.2° C./min.

The single crystal is pulled under conditions, under which a relatively low concentration of oxygen and a relatively high concentration of boron are incorporated into the single crystal. In order to adjust the boron concentration in the single crystal, the melt is doped with boron.

Furthermore, the single crystal is pulled under conditions which allow the formation of monocrystalline silicon in which the vacancies dominate over the interstitial silicon atoms as point defects (v region).

The pulled single crystal is processed to form substrate wafers of monocrystalline silicon. After the processing steps, the substrate wafer has a polished edge and at least one polished side surface. Preferably, both side surfaces, i.e. the front side and the back side, are polished.

An epitaxial layer of silicon is deposited on the polished side surface of the substrate wafer, or the polished front side. Even in the edge region, the resulting epitaxial silicon wafer has a high number of BMD nuclei which can be developed into BMDs.

After standard tests, such as a heat treatment at a temperature of 1000° C. over a period of 16 h, or a first heat treatment at a temperature of 780° C. over a period of 3 h followed by a second heat treatment at a temperature of 1000° C. over a period of 16 h, the BMD density in the region of the substrate wafer of the epitaxial silicon wafer from the center to the edge of the epitaxial silicon wafer is not less than $1\times10^8$ cm$^{-3}$, preferably not less than $5\times10^8$ cm$^{-3}$. Furthermore, the variation of the BMD density along the radius of the epitaxial silicon wafer is low. The BMD density varies by no more than 20% from the average value from the center to the edge of the epitaxial silicon wafer.

In another embodiment, the melt is doped with oxygen, nitrogen and hydrogen. The oxygen concentration is not less than $4.9\times10^{17}$ atoms/cm$^3$ and not more than $5.7\times10^{17}$ atoms/cm$^3$, the nitrogen concentration is not less than $5\times10^{12}$ atoms/cm$^3$ and not more than $3.5\times10^{13}$ atoms/cm3, and the hydrogen concentration is not less than $3\times10^{13}$ atoms/cm$^3$ and not more than $8\times10^{13}$ atoms/cm$^3$.

Furthermore, the single crystal is pulled under conditions which allow the formation of monocrystalline silicon in which the vacancies dominate over the interstitial silicon atoms as point defects (v region).

The presence of hydrogen suppresses the formation of nuclei of OSF defects, and contributes to making the radial profile of the density of BMDs more uniform, particularly in the edge region of the silicon wafer. The hydrogen concentration in the silicon wafer should therefore be not less than $3\times10^{13}$ atoms/cm$^3$. The single crystal is pulled in an atmosphere which contains hydrogen, the partial pressure of hydrogen preferably being not less than 5 Pa and not more than 15 Pa.

A silicon wafer is separated from the grown crystal and processed further. In this case, the upper and lower side surfaces as well as the edge of the silicon wafer are subjected to one or more mechanical processing steps and at least one polish. An epitaxial layer is preferably deposited on the polished side surface of the silicon wafer. The silicon wafer and the epitaxial layer are doped with an electrically active dopant, for example boron, preferably according to the doping of a pp-- doped epitaxial silicon wafer.

The density of BMD nuclei averaged over the radius of the silicon wafer, determined by IR tomography, is not less than $1\times10^5$ cm$^{-3}$ and not more than $1\times10^7$ cm$^{-3}$. The density of BMD nuclei varies by no more than 20% from the average value from the center to the edge of the epitaxial silicon wafer.

The silicon wafer with an epitaxial layer, resulting from the deposition of an epitaxial layer on the front side of the silicon wafer, has, despite the deposition of the epitaxial layer, the potential of being able to form BMDs whose density is sufficient to impart the required effect as in internal Getter to the silicon wafer. The density of BMDs does, however, remain low enough and its radial profile homogeneous enough so that problems due to overlay defects are avoided.

The BMDs are preferably formed in the course of the production of electronic components in the epitaxial layer and heat treatments involved in this. They may, however, also be formed by subjecting the silicon wafer to one or more heat treatments after the deposition of the epitaxial layer and before the production of electronic components.

The features specified in relation to the above-described embodiments of the silicon wafer according to the invention, or the epitaxial silicon wafers according to the invention, may be applied correspondingly to the production method according to the invention. Conversely, the features specified in relation to the above-described embodiments of the method according to the invention may be applied correspondingly to the silicon wafer according to the invention, or the epitaxial silicon wafers according to the invention. These and other features of the embodiments according to the invention will be explained in the description of the figures and in the claims. The individual features may be implemented either separately or in combination as embodiments of the invention. Furthermore, they may describe advantageous embodiments which are individually protectable.

In the examples below, crystals with a diameter of about 300 mm were grown in accordance with the method according to the invention. The radial oxygen variation was determined on these crystals, or the ingot pieces or silicon wafers produced to therefrom.

FIG. 1 shows the radial oxygen profiles, determined by means of FTIR, in the case of different magnetic flux densities (3000 Gs, 2800 Gs, 2720 Gs, 2420 Gs, 2350 Gs)

The crystal rotation is 10 rpm, the crucible rotation is 0.3 rpm. The crystal and the crucible are rotated in the same sense.

The lower the magnetic flux density, the lower the edge decrease.

In the case of a magnetic flux density of 2350 Gs, there is a radial oxygen variation of 2.3%.

In further measurements, it has been found that, in the case of a magnetic flux density of 2150-2350 Gs, the radial oxygen variation is often even less than 2%.

Figure 2:
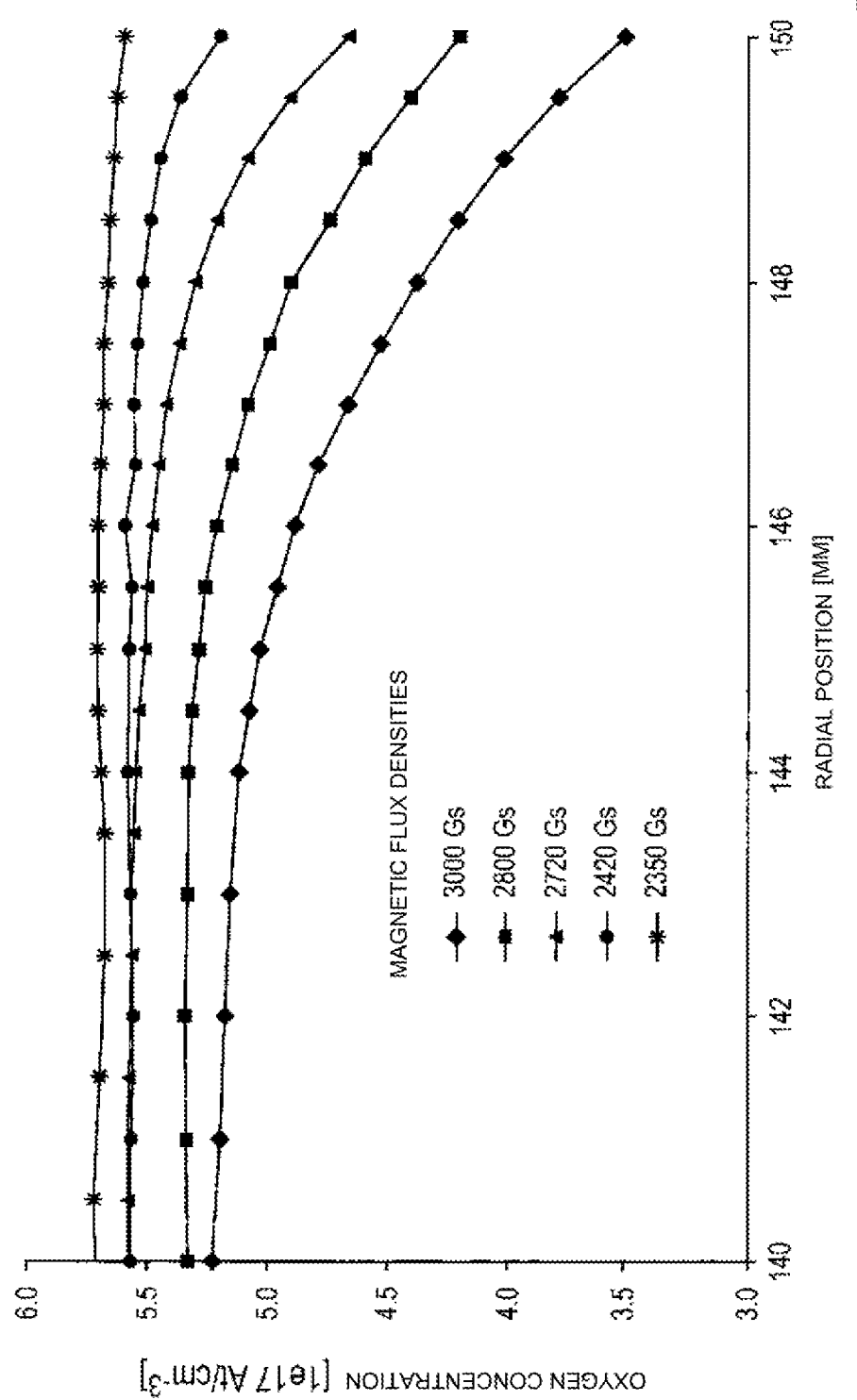
FIG. 2 shows radial oxygen profiles in the case of different magnetic flux densities.

FIG. 2 shows the radial oxygen profiles of FIG. 1 in the edge region (R=140-150 mm). Beyond a radial position of about 144 mm, a significant decrease in the oxygen concentration is found in the case of magnetic flux densities of more than 2700 Gs.

Figure 3:
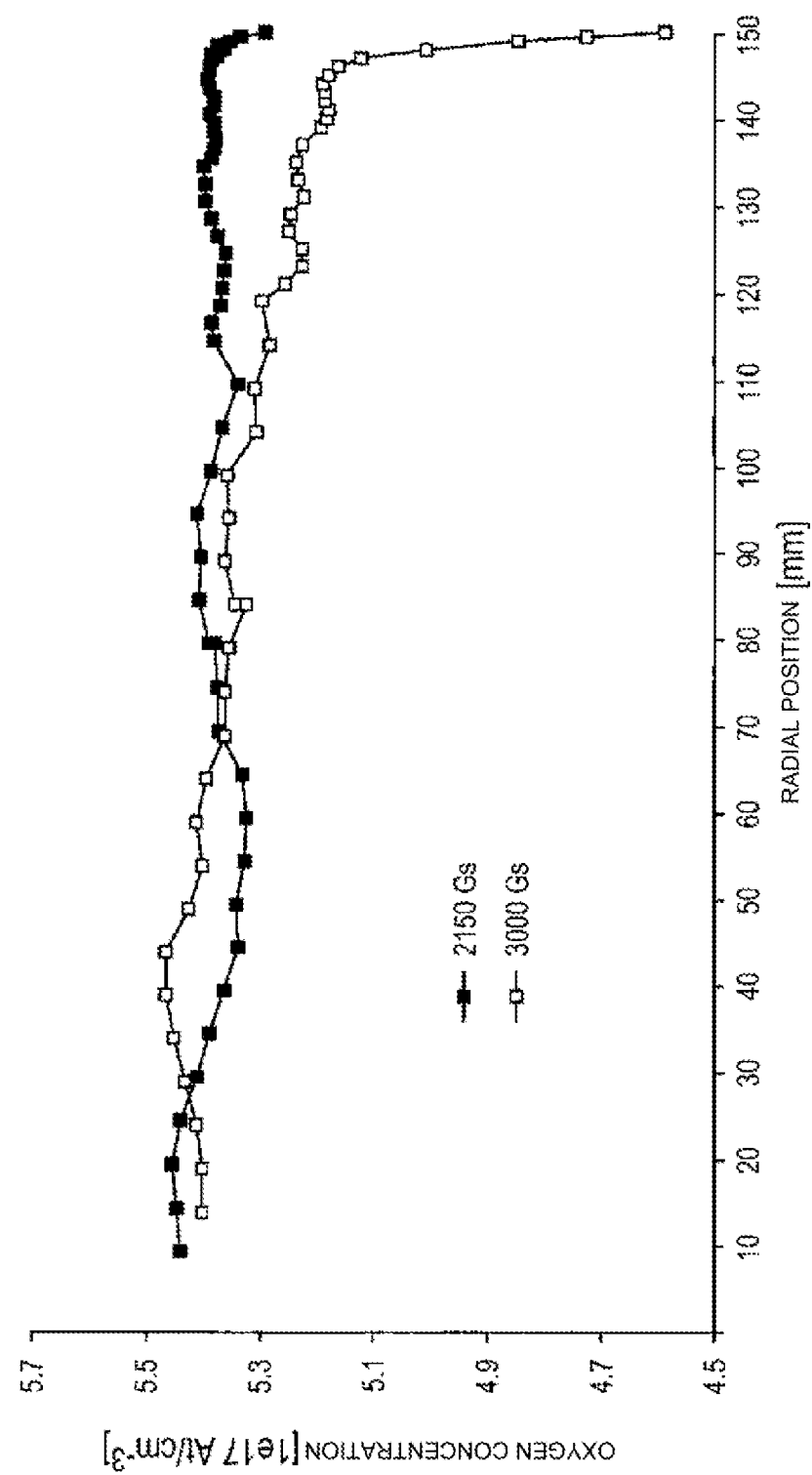
FIG. 3 shows radial oxygen profiles in the case of different magnetic flux densities.

FIG. 3 shows the radial oxygen profiles, determined by means of FTIR, in the case of the magnetic flux densities 2150 Gs and 3000 Gs. The crystal rotation is 10 rpm, the crucible rotation is 0.3 rpm. The crystal and the crucible are rotated in the same sense.

For the radial oxygen variation, if the entire radius is taken into account, 3.1% is found in the case of 2150 Gs and 19.2% is found in the case of 3000 Gs.

If, however, an edge region of 10 mm is not taken into account, i.e. the radial oxygen variation is determined only from R=0 to R=140 mm, 2.5% is found in the case of 2150 Gs and 5.4% is found in the case of 3000 Gs.

This shows a significant decrease in the oxygen concentration at the edge (R=140-150 mm) in the case of excessively high magnetic fields.

Figure 4:
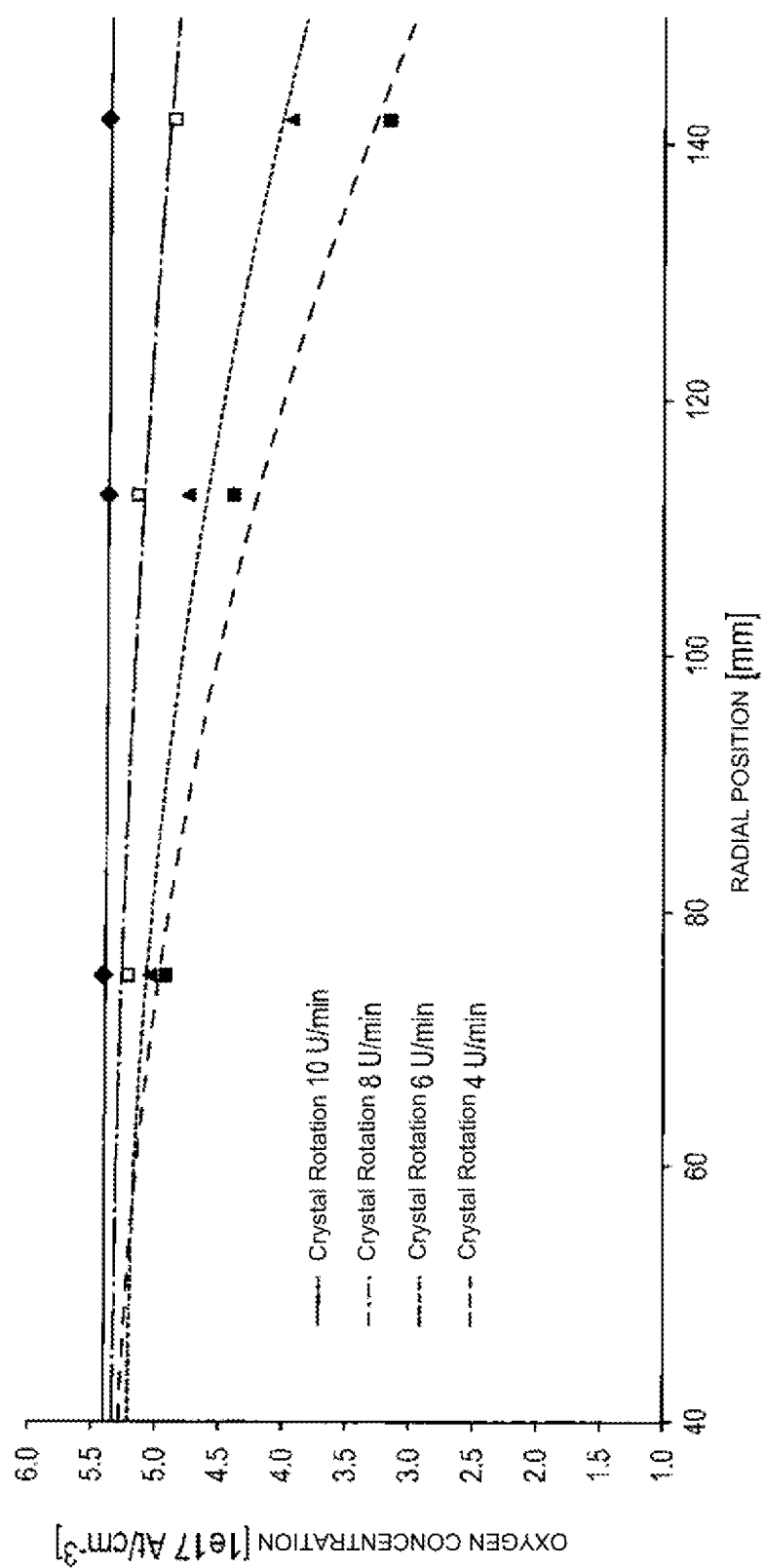
FIG. 4 shows radial oxygen profiles in the case of different crystal rotations.

FIG. 4 shows the radial oxygen profiles, determined by means of FTIR, in the case of different crystal rotations. The crucible rotation is 0.3 rpm. The crystal rotation is varied: 4, 6, 8 and 10 rpm. The magnetic flux density is 2300 Gs.

It is found that the oxygen concentration decreases significantly with decreasing crystal rotation. The decrease already begins at a radial distance of about 80 mm.

In the case of a crystal rotation of 10 rpm, a radial oxygen variation of 1.5% is found.

The above description of exemplary embodiments is to be interpreted by way of example. The disclosure thereby carried out on the one hand makes it possible for the person skilled in the art to understand the present invention and the advantages associated therewith, and on the other hand also comprises variations and modifications of the described structures and methods which are evident within the understanding of the person skilled in the art. All such variations and modifications and equivalents are therefore meant to be covered by the protective scope of the claims.

The invention claimed is:

1. A silicon wafer with a diameter of at least 300 mm, sliced from a silicon single crystal pulled according to the CZ method, having a radial variation of oxygen concentration of less than 7%, calculated according to $(O_{max}-O_{min}/O_{min})*100\%$, wherein $O_{max}$ is the maximal and $O_{min}$ is the minimal oxygen concentration determined over the entire radius of the silicon wafer.

2. The silicon wafer of claim 1, wherein the radial variation of the oxygen concentration is less than 5%.

3. The silicon wafer of claim 1, wherein the radial variation of the oxygen concentration is less than 2%.

4. The silicon wafer of claim 1, wherein the silicon wafer is doped with nitrogen and has a nitrogen concentration of not less than $5\times10^{12}$ atoms/cm$^3$ and not more than $3.5\times10^{13}$ atoms/cm$^3$.

5. The silicon wafer of claim 1, wherein an oxygen concentration in the silicon wafer is from $5\times10^{17}$ atoms/cm$^3$ to $6\times10^{17}$ atoms/cm$^3$.

6. The silicon wafer of claim 5, wherein the silicon wafer is doped with hydrogen and has a hydrogen concentration of not less than $3\times10^{13}$ atoms/cm$^3$ and not more than $8\times10^{13}$ atoms/cm$^3$.

7. An epitaxial silicon wafer which is p/p+ doped, comprising a silicon wafer of claim 1, as a substrate, the epitaxial silicon wafer comprising BMD nuclei whose density, averaged over the radius of the silicon wafer, is not less than $1\times10^5$ cm$^{-3}$ and not more than $1\times10^7$ cm$^{-3}$, a density of BMD nuclei differing by no more than 20% from the average value from the center to the edge of the epitaxial silicon wafer.

8. The epitaxial silicon wafer of claim 7, wherein a resistivity is not less than 5 mΩcm and not more than 10 mΩcm.

9. An epitaxial silicon wafer which is p/p– doped, comprising a silicon wafer of claim 1, as a substrate, the epitaxial silicon wafer having a BMD density in the region of the silicon substrate wafer from the center to the edge of the epitaxial silicon wafer of not less than $1 \times 10^8$ cm$^{-3}$ after a heat treatment at a temperature of 1000° C. over a period of 16 h, a density of BMD differing by no more than 20% from the average value from the center to the edge of the epitaxial silicon wafer.

10. A method for producing a silicon wafer of claim 1, comprising:
   a) providing a silicon melt in a crucible;
   b) pulling a silicon single crystal from the melt according to the CZ method, oxygen being incorporated into the single crystal;
   c) applying a horizontal magnetic field to the melt during the pulling of the silicon single crystal;
   d) rotating the growing crystal and the crucible during the pulling of the single crystal;
   e) providing the silicon wafer by processing the silicon single crystal;

wherein a magnetic flux density of the applied horizontal magnetic field is 1900-2600 Gs in the middle of the crucible, and the growing crystal is rotated at at least 8 rpm.

11. The method as claimed in claim 10, wherein the magnetic flux density is 2000-2400 Gs.

12. The method of claim 10, wherein the magnetic flux density is 2150-2350 Gs.

13. The method of claim 10, wherein the crystal and the crucible are rotated in the same sense, wherein the crucible is rotated at 0.3-0.8 rpm.

14. The method of claim 10, wherein the crystal is rotated at at least 10 rpm.

15. The method of claim 13, wherein the crystal is rotated at at least 10 rpm.

* * * * *